(12) United States Patent
Kobayashi et al.

(10) Patent No.: US 10,746,572 B2
(45) Date of Patent: Aug. 18, 2020

(54) ROTATION DETECTION DEVICE

(71) Applicant: DENSO CORPORATION, Kariya, Aichi-pref. (JP)

(72) Inventors: Atsushi Kobayashi, Kariya (JP); Michihiro Makita, Kariya (JP)

(73) Assignee: DENSO CORPORATION, Kariya (JP)

(*) Notice: Subject to any disclaimer, the term of this patent is extended or adjusted under 35 U.S.C. 154(b) by 54 days.

(21) Appl. No.: 16/082,964

(22) PCT Filed: Jul. 14, 2016

(86) PCT No.: PCT/JP2016/070765
§ 371 (c)(1),
(2) Date: Sep. 7, 2018

(87) PCT Pub. No.: WO2018/011931
PCT Pub. Date: Jan. 18, 2018

(65) Prior Publication Data
US 2019/0101416 A1    Apr. 4, 2019

(51) Int. Cl.
*G01R 33/09* (2006.01)
*G01D 5/245* (2006.01)
(Continued)

(52) U.S. Cl.
CPC ............ *G01D 5/245* (2013.01); *F02D 41/009* (2013.01); *G01D 5/16* (2013.01); *G01D 5/2451* (2013.01);
(Continued)

(58) Field of Classification Search
CPC ........ G01D 5/16; F02D 41/009; G01R 33/091
See application file for complete search history.

(56) References Cited

U.S. PATENT DOCUMENTS

| 5,378,885 A * | 1/1995 | Jones, Jr. | G01R 33/09 235/449 |
| 6,246,233 B1 * | 6/2001 | Griffen | G01D 5/145 324/207.12 |

(Continued)

FOREIGN PATENT DOCUMENTS

| JP | 4466355 B2 | 3/2010 |
| JP | 2012-052960 A | 3/2012 |

*Primary Examiner* — Alvaro E Fortich
(74) *Attorney, Agent, or Firm* — Posz Law Group, PLC

(57) ABSTRACT

A rotation detection device includes a detection unit and a determination circuit unit. A first magnetoresistive element pair, a second magnetoresistive element pair and a third magnetoresistive element pair are located to be farther from the end part than a fourth magnetoresistive element pair and a fifth magnetoresistive element pair are. The second magnetoresistive element pair is located in a region surrounded by the first magnetoresistive element pair, the third magnetoresistive element pair, the fourth magnetoresistive element pair and the fifth magnetoresistive element pair. The detection unit is to generate a main signal based on outputs of the first magnetoresistive element pair, the second magnetoresistive element pair and the third magnetoresistive element pair and to generate a sub signal based on outputs of the fourth magnetoresistive element pair and the fifth magnetoresistive element pair.

4 Claims, 4 Drawing Sheets

(51) Int. Cl.
*G01P 3/488* (2006.01)
*G01P 13/04* (2006.01)
*F02D 41/00* (2006.01)
*G01D 5/16* (2006.01)

(52) U.S. Cl.
CPC .............. *G01P 3/488* (2013.01); *G01P 13/04* (2013.01); *G01R 33/09* (2013.01); *G01R 33/091* (2013.01)

(56) References Cited

U.S. PATENT DOCUMENTS

| | | | |
|---|---|---|---|
| 8,564,283 B2* | 10/2013 | Mita | G01D 5/145 324/207.12 |
| 2003/0007295 A1* | 1/2003 | Kamijima | G11B 5/3903 360/322 |
| 2003/0173955 A1 | 9/2003 | Uenoyama | |
| 2009/0058404 A1 | 3/2009 | Kurumado | |
| 2009/0063103 A1* | 3/2009 | Iwamoto | G01D 5/2448 702/190 |
| 2012/0119729 A1* | 5/2012 | Komasaki | G01D 5/145 324/207.21 |
| 2013/0300402 A1* | 11/2013 | Liu | G01R 33/09 324/202 |
| 2016/0327411 A1* | 11/2016 | Kobayashi | G01D 5/2457 |

* cited by examiner

| | MAIN SIGNAL (S1) | SUB SIGNAL (S2) |
|---|---|---|
| NORMAL ROTATION | FALL FROM Hi TO Lo | Hi |
| INVERSE ROTATION | RISE FROM Lo TO Hi | Hi |

ROTATION DETECTION DEVICE

CROSS REFERENCE TO RELATED APPLICATIONS

The present disclosure relates to a rotation detection device which detects a rotation state of a rotor. This application is a U.S. national phase of International Application No. PCT/JP2016/070765 filed on Jul. 14, 2016, the disclosure of which is incorporated herein by reference.

TECHNICAL FIELD

Background Art

Conventionally, a rotation detection device configured to detect a rotation state of a rotor, for example, is disclosed in Patent Literature 1. Specifically, the rotation detection device includes a sensor chip where plural magnetoresistive elements are provided, a bias magnet that applies a bias magnetic field to each of the magnetoresistive elements, and a processing circuit that executes a signal processing based on an output of each of the magnetoresistive elements. Each of the magnetoresistive elements is located at a position facing the rotor. The magnetoresistive elements constitute plural magnetoresistive element pairs which define half bridge circuits. An intermediate point voltage of each of the magnetoresistive element pairs varies in response to a rotation of the rotor.

PRIOR ART LITERATURE

Patent Literature

Patent Literature 1: JP4466355B2

SUMMARY OF INVENTION

A configuration to generate two signals that are a first differential signal and a second differential signal from outputs of three magnetoresistive element pairs is considered. When the outputs of the magnetoresistive element pairs are defined as A, B and C, the first differential signal is obtained by (A–B)–(B–C). The first differential signal is a signal for detecting a center of a positive amplitude of the rotor or a signal for detecting a center of a negative amplitude of the rotor. The second differential signal is obtained by (A–C). The second differential signal is a signal for determining the positive amplitude or the negative amplitude. Thus, A and C among the outputs of the magnetoresistive element pairs are common parameters in the two differential signals.

In the above configuration, when a gap between the rotation detection device and the rotor becomes larger, a variation of the magnetic field of the bias magnet relative to teeth of the rotor becomes slower. Thus, since signal amplitudes of the first differential signal and the second differential signal become smaller, it is possible that a precision of an output signal corresponding to length centers of the teeth of the rotor is deteriorated. It is considered to increase the signal amplitudes of the first differential signal and the second differential signal by changing a position of one of the three magnetoresistive element pairs in the sensor chip.

However, since one output of the three magnetoresistive element pairs is the common parameter of the two differential signals, the signal amplitudes of the two differential signals have a trade-off relation. In other words, the signal amplitude of one of the first differential signal and the second differential signal becomes larger and the signal amplitude of the other one of the first differential signal and the second differential signal becomes smaller, in response to a case where a position of one of the three magnetoresistive element pairs is changed. Since the signal amplitudes of the first differential signal and the second differential signal are limited, it is difficult to expand a detectable gap of the rotation detection device relative to the rotor.

It is an object of the present disclosure to provide a rotation detection device which can expand a detectable gap relative to a rotor.

According to an aspect of the present disclosure, the rotation detection device includes a detection unit including a plurality of magnetoresistive element pairs that has a resistance value varying in response to a rotation of a rotor which is of a gear type and includes a protrusion part and a recession part that are alternately arranged in a rotation direction of the rotor, and the detection unit including a bias magnet that applies a bias magnetic field to the plurality of the magnetoresistive element pairs, and the detection unit to generate a main signal of waveform corresponding to a recession-protrusion structure of the protrusion part and the recession part and to generate a sub signal of a waveform having a phase difference relative to the main signal based on a change of the resistance value of the plurality of the magnetoresistive element pairs caused in response to the rotor that rotates.

The rotation detection device includes a determination circuit unit to set a binarization threshold for binarizing the main signal and the sub signal, the determination circuit unit to receive the main signal and the sub signal from the detection unit, the determination circuit unit to generate a position signal obtained by binarizing the main signal by comparing the main signal with the binarization threshold, the determination circuit unit to generate a phase signal obtained by binarizing the phase signal by comparing the sub signal with the binarization threshold, and the determination circuit unit to use the position signal as center passing information of the protrusion part and to use the phase signal as rotation state information of the rotor.

The plurality of the magnetoresistive element pairs is located at the bias magnet to be farther from the rotor than an end part of the bias magnet is, the end part of the bias magnet is closest to the rotor, a first magnetoresistive element pair, a second magnetoresistive element pair and a third magnetoresistive element pair of the plurality of the magnetoresistive element pairs are located to be farther from the end part than a fourth magnetoresistive element pair and a fifth magnetoresistive element pair of the plurality of the magnetoresistive element pairs are.

The second magnetoresistive element pair is located in a region surrounded by the first magnetoresistive element pair, the third magnetoresistive element pair, the fourth magnetoresistive element pair and the fifth magnetoresistive element pair.

The detection unit is to generate the main signal based on outputs of the first magnetoresistive element pair, the second magnetoresistive element pair and the third magnetoresistive element pair and to generate the sub signal based on outputs of the fourth magnetoresistive element pair and the fifth magnetoresistive element pair.

Thus, the signal amplitude of the main signal increases in accordance with an increase in distance between the first magnetoresistive element pair and the rotor and distance between the third magnetoresistive element pair and the rotor. The signal amplitude of the sub signal independent from the main signal increases in accordance with a decrease in distance between the fourth magnetoresistive element pair and the rotor and distance between the fifth magnetoresistive element pair and the rotor. In other words, both the signal amplitudes of the main signal and the sub signal can be maximized by arranging each of the magnetoresistive element pairs to increase both the signal amplitudes of the main signal and the sub signal. Thus, even though the gap relative to the rotor becomes larger, the signal amplitudes of the main signal and the sub signal can be ensured. Then, the detectable gap relative to the rotor can be expanded.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Figure 1:
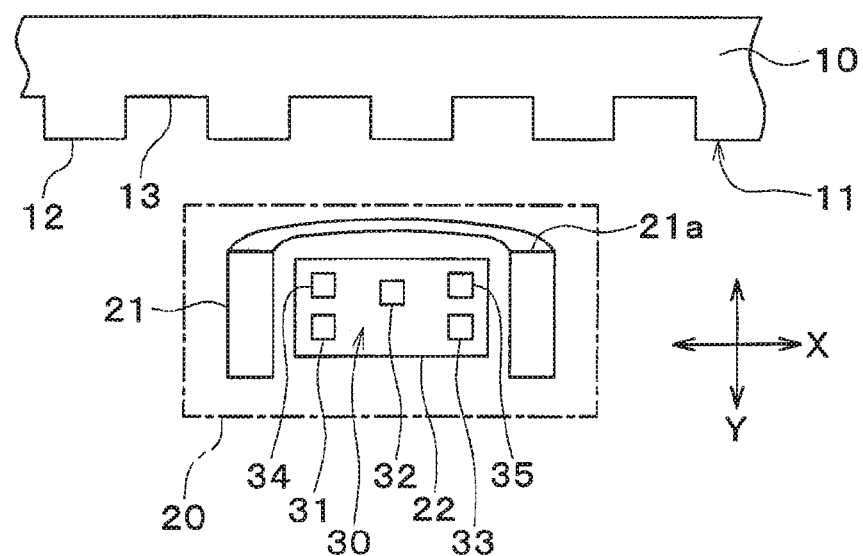
FIG. 1 is a diagram showing an arrangement of a rotation detection device and a rotor of a gear type, according to a first embodiment of the present disclosure.

Hereinafter, a first embodiment of the present disclosure will be described with reference to the drawings. In the following embodiments, the same or equivalent parts are denoted by the same reference numerals as each other, and explanations will be provided to the same reference numerals.

First Embodiment

Hereinafter, a first embodiment of the present disclosure will be described with reference to the drawings. A rotation detection device according to the present disclosure, for example, is used as a crank angle detection device of an internal combustion engine. As shown in FIG. 1, the rotation detection device 20 is located to face an outer peripheral part 11 of a rotor 10 of a gear type. The rotor 10 is fixed to a crank shaft of an engine that is the internal combustion engine. The outer peripheral part 11 of the rotor 10 includes a protrusion part 12 and a recession part 13 which are alternately arranged in a rotation direction of the rotor 10. As shown in FIG. 1, a part of the outer peripheral part 11 of the rotor 10 is linearly expanded.

The rotation detection device 20 is configured to detect a rotation state of the rotor 10. The rotation detection device 20 includes a bias magnet 21 that is a cylindrical shape, and a sensor chip 22 that is located at a position that is predetermined relative to the bias magnet 21.

The bias magnet 21 functions to cause a detection sensitivity of a magnetic field of the sensor chip 22 to increase by a constant value by applying a bias magnetic field to the sensor chip 22. The bias magnet 21 includes a hollow part where the sensor chip 22 is located.

The sensor chip 22 is constituted by a semiconductor chip. The sensor chip 22 includes a detection unit 30 that is configured to output a signal in response to a crank angle that corresponds to a position of the protrusion part 12 in a rotation of the rotor 10. The detection unit 30 includes a first magnetoresistive element pair 31, a second magnetoresistive element pair 32, a third magnetoresistive element pair 33, a fourth magnetoresistive element pair 34 and a fifth magnetoresistive element pair 35 which have resistance values varying in response to the rotation of the rotor 10.

Figure 2:
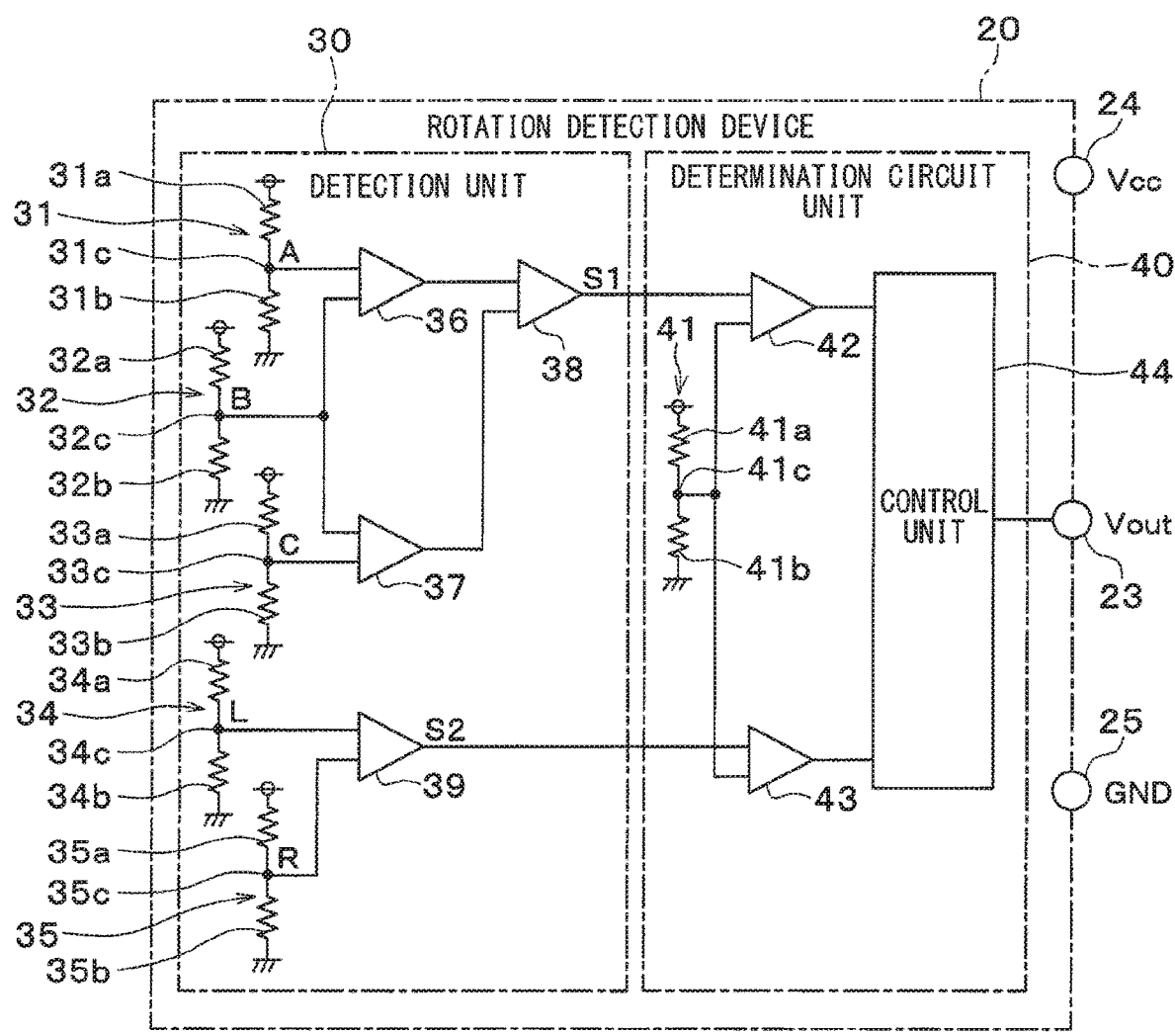
FIG. 2 is a diagram showing a circuit configuration of the rotation detection device shown in FIG. 1.

Each of the magnetoresistive element pairs 31 to 35 constitutes a half bridge circuit. Specifically, as shown in FIG. 2, the first magnetoresistive element pair 31 is constituted by two magnetoresistive elements 31a and 31b which are connected between a power (Vcc) and a ground (GND) in a series connection. The first magnetoresistive element pair 31 detects a change of the resistance value when the magnetoresistive elements 31a and 31b are affected by a magnetic field while the rotor 10 rotates. The first magnetoresistive element pair 31 outputs a voltage of an intermediate point 31c of the magnetoresistive elements 31a and 31b as a waveform signal, based on the change of the resistance value.

The second magnetoresistive element pair 32, the third magnetoresistive element pair 33, the fourth magnetoresistive element pair 34 and the fifth magnetoresistive element pair 35 also have configurations the same as the configuration of the first magnetoresistive element pair 31. The second magnetoresistive element pair 32 is constituted by two magnetoresistive elements 32a and 32b. The second magnetoresistive element pair 32 outputs a voltage of an intermediate point 32c of the magnetoresistive elements 32a and 32b as a waveform signal. The third magnetoresistive element pair 33 is constituted by two magnetoresistive elements 33a and 33b. The third magnetoresistive element pair 33 outputs a voltage of an intermediate point 33c of the magnetoresistive elements 33a and 33b as a waveform signal.

The fourth magnetoresistive element pair 34 is constituted by two magnetoresistive elements 34a and 34b. The fourth magnetoresistive element pair 34 outputs a voltage of an intermediate point 34c of the magnetoresistive elements 34a and 34b as a waveform signal. The fifth magnetoresistive element pair 35 is constituted by two magnetoresistive elements 35a and 35b. The fifth magnetoresistive element pair 35 outputs a voltage of an intermediate point 35c of the magnetoresistive elements 35a and 35b as a waveform signal.

The detection unit 30 further includes a first operational amplifier 36, a second operational amplifier 37, a third operational amplifier 38 and a fourth operational amplifier 39, in addition of the magnetoresistive element pairs 31 to 35. When the voltage of the intermediate point 31c of the first magnetoresistive element pair 31 is defined as an intermediate voltage A and the voltage of the intermediate point 32c of the second magnetoresistive element pair 32 is defined as an intermediate voltage B, the first operational amplifier 36 is a differential amplifier that calculates a result obtained by subtracting the intermediate voltage B from the intermediate voltage A and outputs the result that is A−B. When the voltage of the intermediate point 33c of the third magnetoresistive element pair 33 is defined as an intermediate voltage C, the second operational amplifier 37 is a differential amplifier that calculates a result obtained by subtracting the intermediate voltage C from the intermediate voltage B and outputs the result that is B−C.

The third operational amplifier 38 is a differential amplifier that receives A−B from the first operational amplifier 36 and B−C from the second operational amplifier 37, calculates a result obtained by subtracting B–C from A–B that is (A–B)–(B–C), and outputs the result as S1 that is A+C–2B. A signal of S1 is a main signal of a waveform corresponding to a recession-protrusion structure of the protrusion part 12 and the recession part 13 of the rotor 10. For example, the main signal S1 is a signal of a waveform which is maximum or minimum in amplitude at an edge part of the recession part 13 and the protrusion part 12 of the rotor 10.

The main signal S1 is a signal that remarkably reflects an influence of a term of –2B. It is because magnetic directions of free magnetic layers of the first magnetoresistive element pair 31 and the third magnetoresistive element pair 33 slightly vary relative to the recession-protrusion structure of the rotor 10 while a magnetic direction of a free magnetic layer of the second magnetoresistive element pair 32 remarkably varies relative to the recession-protrusion structure of the rotor 10.

When the voltage of the intermediate point 34*c* of the fourth magnetoresistive element pair 34 is defined as an intermediate voltage L and the voltage of the intermediate point 35*c* of the fifth magnetoresistive element pair 35 is defined as an intermediate voltage R, the fourth operational amplifier 39 is a differential amplifier that calculates a result obtained by subtracting the intermediate voltage R from the intermediate voltage L and outputs the result that is L–R as S2. A signal of S2 is a sub signal of a waveform having a phase difference relative to the main signal S1. For example, the sub signal S2 becomes maximum in amplitude at a center of the protrusion part 12 of the rotor 10 in a rotation direction of the protrusion part 12 and becomes minimum in amplitude at a center of the recession part 13 in a rotation direction of the recession part 13.

As the above description, the detection unit 30 generates the main signal S1 that is (A–B)–(B–C), based on outputs of the first magnetoresistive element pair 31, the second magnetoresistive element pair 32 and the third magnetoresistive element pair 33. The detection unit 30 generates the sub signal S2 that is L–R, based on outputs of the fourth magnetoresistive element pair 34 and the fifth magnetoresistive element pair 35. Each of the operational amplifiers 36 to 39 is configured to output a signal by offset adjusting the signal.

The rotation detection device 20 includes a determination circuit unit 40 that generates a signal in response to a rotation state of the rotor 10 detected by the detection unit 30. The determination circuit unit 40 may be attached to the sensor chip 22 or may be attached to another semiconductor chip that is not shown.

The determination circuit unit 40 includes a threshold generation unit 41, a first comparator 42, a second comparator 43 and a control unit 44. The threshold generation unit 41 is constituted by two resistors 41*a* and 41*b* which are connected between the power (Vcc) and the ground (GND) in a series connection. A voltage of an intermediate point 41*c* of the resistors 41*a* and 41*b* is a binarization threshold. The binarization threshold is used as a threshold to binarize the main signal S1 and the sub signal S2.

The first comparator 42 receives the main signal S1 from the third operational amplifier 38 of the detection unit 30 and also receives the binarization threshold value from the threshold generation unit 41. The first comparator 42 compares the main signal S1 with the binarization threshold value and generates a position signal obtained by binarizing the main signal S1.

The second comparator 43 receives the sub signal S2 from the fourth operational amplifier 39 of the detection unit 30 and also receives the binarization threshold value from the threshold generation unit 41. The second comparator 43 compares the sub signal S2 with the binarization threshold value and generates a phase signal obtained by binarizing the sub signal S2.

The control unit 44 is a control circuit that receives the position signal from the first comparator 42 as center passing information of the protrusion part 12 and also receives the phase signal from the second comparator 43 as rotation state information of the rotor 10. The control unit 44 has a function to determine whether the rotation direction of the rotor 10 is in a normal rotation or an inverse rotation based on the center passing information and the rotation state information. The control unit 44 outputs information of the position signal and the rotation direction of the rotor 10 to an external device that is not shown through an output terminal 23 (Vout).

The above description relates to an entire configuration of the rotation detection device 20 according to the present embodiment. The rotation detection device 20 includes a power terminal 24 (Vcc) and a ground terminal 25 (GND) which are connected with external devices. The rotation detection device 20 receives a power supply from an external device through the power terminal 24 and the ground terminal 25.

Next, arrangement relationships of the magnetoresistive element pairs 31 to 35 in the sensor chip 22 will be described. As shown in FIG. 1, each of the magnetoresistive element pairs 31 to 35 is located at the bias magnet 21 to be farther from the rotor 10 than an end part 21*a* of the bias magnet 21 is. The end part 21*a* is an end part of the bias magnet 21 which is closest to the rotor 10. In other words, all of the magnetoresistive element pairs 31 to 35 are located in the hollow part of the bias magnet 21.

The first magnetoresistive element pair 31, the second magnetoresistive element pair 32 and the third magnetoresistive element pair 33 of the magnetoresistive element pairs 31 to 35 are located to be farther from the end part 21*a* of the bias magnet 21 than the fourth magnetoresistive element pair 34 and the fifth magnetoresistive element pair 35 of the magnetoresistive element pairs 31 to 35 are. In other words, the magnetoresistive element pairs 31, 32 and 33 for generating the main signal S1 are located to be farther from the end part 21*a* of the bias magnet 21 than the magnetoresistive element pairs 34 and 35 for generating the sub signal S2.

The second magnetoresistive element pair 32 is located in a region surrounded by the first magnetoresistive element pair 31, the third magnetoresistive element pair 33, the fourth magnetoresistive element pair 34 and the fifth magnetoresistive element pair 35. The region is the maximum region defined by connecting the magnetoresistive element pairs 31, 33, 34 and 35 on a surface of the semiconductor chip constituting the sensor chip 22.

Further, the second magnetoresistive element pair 32 is located to be closer to the fourth magnetoresistive element pair 34 and the fifth magnetoresistive element pair 35 than to the first magnetoresistive element pair 31 and the third magnetoresistive element pair 33. Thus, the main signal S1 is remarkably influenced by the term of –2B. In other words, a precision of a center arrangement of the teeth improves in an X direction. The amplitude of the main signal S1 improves at a position in a Y direction close to the magnetoresistive element pairs 34 and 35. Thus, a detectable gap of the rotation detection device 20 can be expanded.

It is preferable that the fourth magnetoresistive element pair 34, the second magnetoresistive element pair 32 and the fifth magnetoresistive element pair 35 are located at positions where a magnetic flux of a magnetic field generated in the hollow part of the bias magnet 21 close to the end part 21a is greater than or equal to a predetermined value. Thus, detection sensitivities of the fourth magnetoresistive element pair 34, the second magnetoresistive element pair 32 and the fifth magnetoresistive element pair 35 can be improved.

When the rotation detection device 20 is not affected by the rotor 10, a bias magnetic field is applied to the second magnetoresistive element pair 32 in a direction along a central axis of the bias magnet 21. A bias magnetic field surrounding end parts of the bias magnet 21 is applied to the magnetoresistive element pairs 31, 33, 34 and 35.

Specifically, a magnetic field facing radially outward from the central axis of the bias magnet 21 is applied to magnetoresistive element pairs 31, 33, 34 and 35. Bias magnetic fields, which are symmetrical to each other about the central axis of the bias magnet 21 as a center, are applied to the first magnetoresistive element pair 31 and the third magnetoresistive element pair 33. Bias magnetic fields, which are symmetrical to each other about the central axis of the bias magnet 21 as a center, are applied to the fourth magnetoresistive element pair 34 and the fifth magnetoresistive element pair 35.

Arrangements of the magnetoresistive element pairs 31 to 35 are based on following inventors' study. Distances of the magnetoresistive element pairs 31 to 35 relative to the end part 21a of the bias magnet 21 as a reference in the Y direction that is a radial direction of the rotor 10 are defined as D. As shown in FIG. 1, a direction perpendicular to the Y direction is the X direction.

The inventors studied a variation of the amplitude of the main signal S1 when values of the distances D of the first magnetoresistive element pair 31 and the third magnetoresistive element pair 33 are caused to vary. The inventors studied a variation of the amplitude of the sub signal S2 when values of the distances D of the fourth magnetoresistive element pair 34 and the fifth magnetoresistive element pair 35 are caused to vary.

Figure 3:
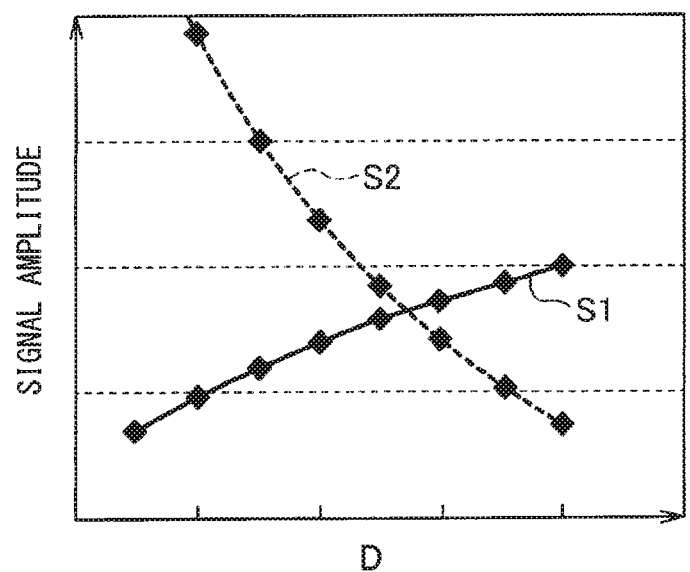
FIG. 3 is a graph showing signal amplitudes of a main signal (S1) and a sub signal (S2) in respond to positions of respective magnetoresistive element pairs

As shown in FIG. 3, regarding the main signal S1, a signal amplitude that is the amplitude of the main signal S1 increases in accordance with an increase in distances D. In other words, when the first magnetoresistive element pair 31 and the third magnetoresistive element pair 33 becomes farther from the end part 21a of the bias magnet 21, the signal amplitude increases. Regarding the sub signal S2, a signal amplitude that is the amplitude of the sub signal S2 increases in accordance with a decrease in distances D. In other words, when the fourth magnetoresistive element pair 34 and the fifth magnetoresistive element pair 35 becomes closer to the end part 21a of the bias magnet 21, the signal amplitude increases.

Thus, the signal amplitude of the main signal S1 can be expanded by moving the first magnetoresistive element pair 31 and the third magnetoresistive element pair 33 which generate the main signal S1 away from the end part 21a of the bias magnet 21. Further, the signal amplitude of the sub signal S2 can be expanded by approaching the fourth magnetoresistive element pair 34 and the fifth magnetoresistive element pair 35 which generate the sub signal S2 toward the end part 21a of the bias magnet 21, without the signal amplitude of the main signal S1. In other words, the signal amplitude of the sub signal S2 can be adjusted independently from the signal amplitude of the main signal S1.

Figures 4, 5:
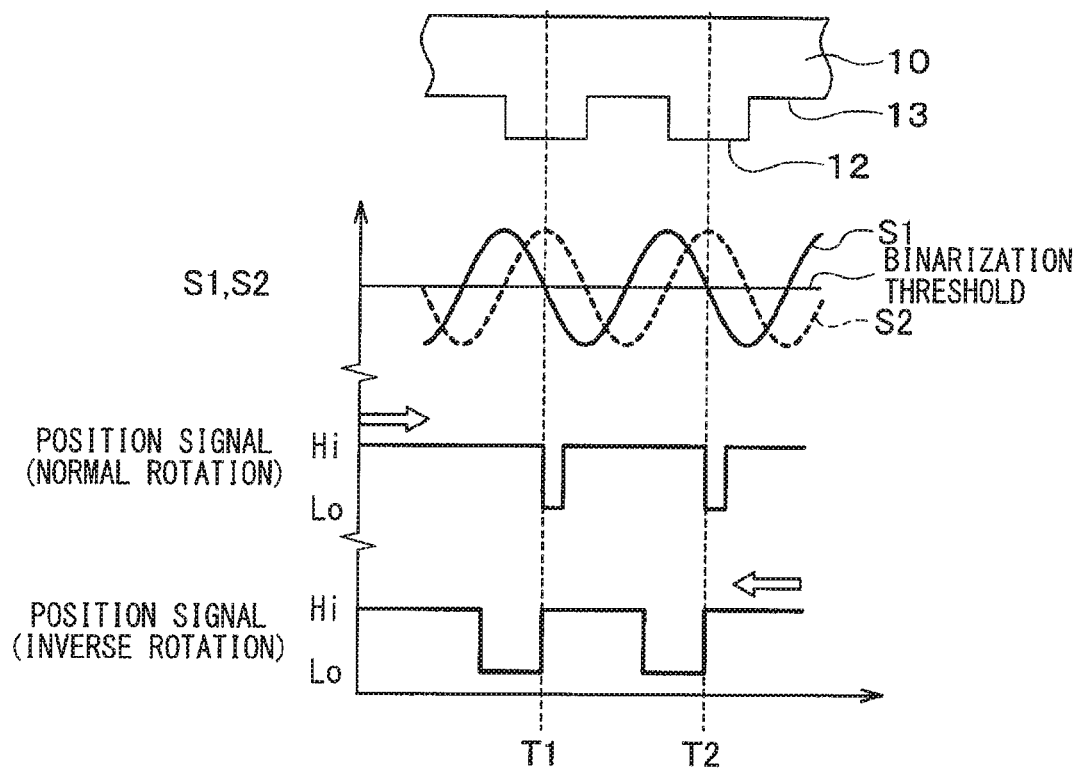
FIG. 4 is time chart illustrating an operation of the rotation detection device.
FIG. 5 is a diagram showing determination conditions of a rotation direction of the rotor.

Next, an operation of the rotation detection device 20 will be described. When the rotor 10 rotates, the detection unit 30 acquires the main signal S1 and the sub signal S2 based on a variation of the gap between the detection unit 30 and the outer peripheral part 11 of the rotor 10 as shown in FIG. 4.

The main signal S1 is a signal of a waveform that exceeds the binarization threshold at the center of the protrusion part 12 of the rotor 10 in the rotation direction of the protrusion part 12. The sub signal S2 is a signal of a waveform that has a phase difference relative to the main signal S1. Specifically, the sub signal S2 is a signal of a waveform where the amplitude of the signal becomes maximum at the center of the protrusion part 12 of the rotor 10 in the rotation direction of the protrusion part 12.

The first comparator 42 of the determination circuit unit 40 compares the main signal S1 acquired by the detection unit 30 with the binarization threshold. When the signal amplitude of the main signal S1 is greater than the binarization threshold, the first comparator 42 generates the position signal of Hi. When the signal amplitude of the main signal S1 is less than the binarization threshold, the first comparator 42 generates the position signal of Lo.

The second comparator 43 of the determination circuit unit 40 compares the sub signal S2 acquired by the detection unit 30 with the binarization threshold. When the amplitude of the sub signal S2 is greater than the binarization threshold, the second comparator 43 generates the phase signal of Hi. When the amplitude of the sub signal S2 is less than the binarization threshold, the second comparator 43 generates the phase signal of Lo.

As the above description, the main signal S1, the sub signal S2, the position signal and the phase signal are timely generated in response to the rotation of the rotor 10. The position signal and the phase signal are transmitted to the control unit 44. The determination circuit unit 40 executes a processing to output the position signal to an external device as an output signal.

The control unit 44 determines whether the rotation direction of the rotor 10 is a normal or inverse based on the center passing information of the position signal and the rotation state information of the phase signal.

When the rotation direction of the rotor 10 is in the normal rotation, the amplitude of the main signal S1 becomes less than the binarization threshold around a time point T1. Thus, the position signal changes from Hi to Lo. Since the signal amplitude of the sub signal S2 is greater than the binarization threshold, the phase signal that is binarized becomes Hi. Thus, the control unit 44 determines that the rotor 10 is in the normal rotation under a condition where the position signal falls from Hi to Lo and the phase signal is Hi.

When the rotation direction of the rotor 10 is in the inverse rotation, the amplitude of the main signal S1 becomes greater than the binarization threshold around the time point T1. Thus, the position signal changes from Lo to Hi, Since the signal amplitude of the sub signal S2 is greater than the binarization threshold, the phase signal that is binarized becomes Hi. Thus, the control unit 44 determines that the rotor 10 is in the inverse rotation under a condition where the position signal rises from Lo to Hi and the phase signal is Hi.

The above determination is also applied to a determination around a time point T2. In other words, the control unit 44 determines the rotation direction of the rotor 10 by determining whether conditions shown in FIG. 5 are met.

As the above description, the first magnetoresistive element pair 31, the second magnetoresistive element pair 32 and the third magnetoresistive element pair 33 which are necessary to generate the main signal S1 are separated from the fourth magnetoresistive element pair 34 and the fifth magnetoresistive element pair 35 which are necessary to generate the sub signal S2. Thus, the magnetoresistive element pairs 31 to 35 can be arranged to increase both the signal amplitude of the main signal S1 and the signal amplitude of the sub signal S2. Thus, the signal amplitudes of the main signal S1 and the sub signal S2 can be maximized.

As the above description, since the both the signal amplitudes of the main signal S1 and the sub signal S2 can be increased, the signal amplitudes of the main signal S1 and the sub signal S2 are unnecessary to be decreased even though the gap of the rotation detection device 20 relative to the rotor 10 becomes larger. Thus, the detectable gap of the rotation detection device 20 relative to the rotor 10 can be expanded.

Other Embodiments

The configuration of the rotation detection device 20 according to the above embodiment is an example of the present disclosure, and the configuration is not limited and can be achieved by other configurations within the present disclosure. For example, the binarization threshold may be set independently for each of the comparators 42 and 43.

Each of the comparators 42 and 43 may have a hysteresis characteristic. In this case, the first comparator 42 is set such that the binarization threshold becomes a first value when the main signal S1 becomes less than the binarization threshold and the binarization threshold becomes a second value that is less than the first value when the main signal S1 becomes greater than the binarization threshold. In other words, the first comparator 42 switches the binarization threshold to the first value or the second value according to the main signal S1. Thus, since the main signal S1 is unlikely to exceed the binarization threshold even though a noise occurs in the main signal S1, a noise immunity improves.

Similarly, the second comparator 43 is set such that the binarization threshold becomes a first value when the sub signal S2 becomes less than the binarization threshold and the binarization threshold becomes a second value that is less than the first value when the sub signal S2 becomes greater than the binarization threshold.

According to the above embodiment, the second magnetoresistive element pair 32 is located to be closer to the fourth magnetoresistive element pair 34 and the fifth magnetoresistive element pair 35 than to the first magnetoresistive element pair 31 and the third magnetoresistive element pair 33. It is an example of the arrangements. The second magnetoresistive element pair 32 may be located at other positions.

According to the above embodiment, the rotor 10 is fixed to the crank shaft of the engine that is the internal combustion engine. However, the rotation detection device 20 is not limited to be applied to the internal combustion engine.

According to the above embodiment, the phase signal indicating rotation state information of the rotor 10 is used to in the determination of the rotation direction of the rotor 10. It is an example of using the phase signal. For example, the phase signal may be used in a determination on allowing or prohibiting an output of the position signal transmitted from the control unit 44 to an external device.

While the present disclosure has been described with reference to the embodiments thereof, it is to be understood that the disclosure is not limited to the embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

The invention claimed is:

1. A rotation detection device comprising:
   a detection unit including
      a plurality of magnetoresistive element pairs that has a resistance value varying in response to a rotation of a rotor which is of a gear type and includes a protrusion part and a recession part that are alternately arranged in a rotation direction of the rotor, and the detection unit including
      a bias magnet that applies a bias magnetic field to the plurality of the magnetoresistive element pairs,
   the detection unit
      to generate a main signal of waveform corresponding to a recession-protrusion structure of the protrusion part and the recession part and
      to generate a sub signal of a waveform having a phase difference relative to the main signal based on a change of the resistance value of the plurality of the magnetoresistive element pairs caused in response to the rotor that rotates; and
   a determination circuit unit
      to set a binarization threshold for binarizing the main signal and the sub signal, the determination circuit unit
      to receive the main signal and the sub signal from the detection unit, the determination circuit unit
      to generate a position signal obtained by binarizing the main signal by comparing the main signal with the binarization threshold, the determination circuit unit
      to generate a phase signal obtained by binarizing the phase signal by comparing the sub signal with the binarization threshold, the determination circuit unit
      to use the position signal as center passing information of the protrusion part and to use the phase signal as rotation state information of the rotor, wherein
   the plurality of the magnetoresistive element pairs is located at the bias magnet to be farther from the rotor than an end part of the bias magnet is,
   the end part of the bias magnet is closest to the rotor,
   a first magnetoresistive element pair, a second magnetoresistive element pair and a third magnetoresistive element pair of the plurality of the magnetoresistive element pairs are located to be farther from the end part than a fourth magnetoresistive element pair and a fifth magnetoresistive element pair of the plurality of the magnetoresistive element pairs are,
   the second magnetoresistive element pair is located in a region surrounded by the first magnetoresistive element pair, the third magnetoresistive element pair, the fourth magnetoresistive element pair and the fifth magnetoresistive element pair, and
   the detection unit is to generate the main signal based on outputs of the first magnetoresistive element pair, the second magnetoresistive element pair and the third magnetoresistive element pair and to generate the sub signal based on outputs of the fourth magnetoresistive element pair and the fifth magnetoresistive element pair.

2. The rotation detection device according to claim 1, wherein
   the second magnetoresistive element pair is located to be closer to the fourth magnetoresistive element pair and the fifth magnetoresistive element pair than to the first magnetoresistive element pair and the third magnetoresistive element pair.

3. The rotation detection device according to claim 1, wherein
the control unit determines whether the rotation direction of the rotor is in a normal rotation or in an inverse rotation based on the center passing information and the rotation state information.

4. A rotation detection device comprising:
a detection unit including
a plurality of magnetoresistive element pairs that has a resistance value varying in response to a rotation of a rotor which is of a gear type and includes a protrusion part and a recession part that are alternately arranged in a rotation direction of the rotor, and the detection unit including
a bias magnet that applies a bias magnetic field to the plurality of the magnetoresistive element pairs,
the detection unit
to generate a main signal of waveform corresponding to a recession-protrusion structure of the protrusion part and the recession part and
to generate a sub signal of a waveform having a phase difference relative to the main signal based on a change of the resistance value of the plurality of the magnetoresistive element pairs caused in response to the rotor that rotates; and
a determination circuit unit
to set a binarization threshold for binarizing the main signal and the sub signal, the determination circuit unit
to receive the main signal and the sub signal from the detection unit, the determination circuit unit
to generate a position signal obtained by binarizing the main signal by comparing the main signal with the binarization threshold, the determination circuit unit
to generate a phase signal obtained by binarizing the sub signal by comparing the sub signal with the binarization threshold, the determination circuit unit
to use the position signal as center passing information of the protrusion part and to use the phase signal as rotation state information of the rotor, wherein
the plurality of the magnetoresistive element pairs is located at the bias magnet to be farther from the rotor than an end part of the bias magnet is,
the end part of the bias magnet is closest to the rotor,
a first magnetoresistive element pair, a second magnetoresistive element pair and a third magnetoresistive element pair of the plurality of the magnetoresistive element pairs are located to be farther from the end part than a fourth magnetoresistive element pair and a fifth magnetoresistive element pair of the plurality of the magnetoresistive element pairs are,
the second magnetoresistive element pair is located in a region surrounded by the first magnetoresistive element pair, the third magnetoresistive element pair, the fourth magnetoresistive element pair and the fifth magnetoresistive element pair, and
the detection unit is to generate the main signal based on outputs of the first magnetoresistive element pair, the second magnetoresistive element pair and the third magnetoresistive element pair and to generate the sub signal based on outputs of the fourth magnetoresistive element pair and the fifth magnetoresistive element pair.

* * * * *